United States Patent
Lipson et al.

(10) Patent No.: US 7,668,220 B2
(45) Date of Patent: Feb. 23, 2010

(54) SINGLE MODE VERTICAL CAVITY SURFACE EMITTING LASER USING PHOTONIC CRYSTALS WITH A CENTRAL DEFECT

(75) Inventors: Jan Lipson, Cupertino, CA (US); Thomas Lenosky, Mountain View, CA (US); Hongyu Deng, Arcadia, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/423,791

(22) Filed: Apr. 14, 2009

(65) Prior Publication Data

US 2009/0232176 A1   Sep. 17, 2009

Related U.S. Application Data

(60) Division of application No. 10/913,625, filed on Aug. 6, 2004, now abandoned, which is a continuation of application No. 10/256,001, filed on Sep. 26, 2002, now Pat. No. 6,810,056.

(51) Int. Cl.
    *H01S 5/00* (2006.01)
(52) U.S. Cl. .............. 372/50.124; 372/45.012; 372/43.01; 372/98; 372/99; 372/102
(58) Field of Classification Search ............ 372/50.124, 372/45.012, 43.01, 98, 99, 102
    See application file for complete search history.

(56) References Cited

U.S. PATENT DOCUMENTS

| | | | | |
|---|---|---|---|---|
| 6,134,043 | A * | 10/2000 | Johnson et al. | 359/237 |
| 6,363,096 | B1 * | 3/2002 | Dodabalapur et al. | 372/75 |
| 6,683,898 | B2 * | 1/2004 | Østergaard et al. | 372/43.01 |
| 6,704,343 | B2 * | 3/2004 | Deng et al. | 372/97 |
| 6,778,581 | B1 * | 8/2004 | Lipson | 372/96 |
| 6,810,056 | B1 * | 10/2004 | Lipson et al. | 372/46.01 |
| 6,829,281 | B2 * | 12/2004 | Deng et al. | 372/96 |
| 7,126,975 | B2 * | 10/2006 | Iwasaki et al. | 372/69 |
| 2001/0026857 | A1 * | 10/2001 | Kinoshita | 428/105 |
| 2002/0079497 | A1 * | 6/2002 | Gopinath | 257/79 |
| 2002/0126713 | A1 * | 9/2002 | Ibanescu et al. | 372/6 |
| 2002/0163947 | A1 * | 11/2002 | Ostergaard et al. | 372/43 |
| 2003/0235229 | A1 * | 12/2003 | Deng et al. | 372/96 |
| 2004/0013157 | A1 * | 1/2004 | Deng et al. | 372/97 |
| 2004/0091010 | A1 * | 5/2004 | Choquette et al. | 372/44 |
| 2004/0213316 | A1 * | 10/2004 | Lipson | 372/99 |

* cited by examiner

*Primary Examiner*—Wael Fahmy
*Assistant Examiner*—Hrayr A Sayadian
(74) *Attorney, Agent, or Firm*—Workman Nydegger

(57) ABSTRACT

Vertical cavity surface emitting lasers are disclosed, one example of which includes a substrate upon which a lower mirror layer is formed. An active region and upper mirror layer are disposed, in that order, on the lower mirror layer. In particular, the upper mirror layer includes a plurality of DBR layers formed on the active region. The upper mirror layer additionally includes a photonic crystal formed on the plurality of DBR layers and having a periodic structure that contributes to the definition of a central defect. As a consequence of this structure, the photonic crystal has a reflectivity that is wavelength dependent, and the central defect enables the VCSEL to propagate a single mode.

10 Claims, 3 Drawing Sheets

SINGLE MODE VERTICAL CAVITY SURFACE EMITTING LASER USING PHOTONIC CRYSTALS WITH A CENTRAL DEFECT

RELATED APPLICATION

This application is a divisional application of U.S. patent application Ser. No. 10/913,625, entitled Single Mode Vertical Cavity Surface Emitting Laser Using Photonic Crystals With a Central Defect, filed Aug. 6, 2004, which is a continuation of application Ser. No. 10/256,001, filed Sep. 26, 2002, both of which are hereby incorporated herein by reference.

BACKGROUND OF THE INVENTION

1. The Field of the Invention

The present invention relates to vertical cavity surface emitting lasers. More particularly, the present invention relates to single mode vertical cavity surface emitting lasers that use photonic crystals with a central defect.

2. Background and Related Art

Vertical cavity surface emitting lasers (VCSELSs) are an example of semiconductor lasers used in fiber optical systems and have several advantages over other types of semiconductor lasers. VCSELs can be manufactured in large quantities due to their relatively small size and can often be tested on a single wafer. VCSELs typically have low threshold currents and can be modulated at high speeds. VCSELs also couple well with optical fibers.

VCSELs are typically made from both GaAs semiconductor materials and InP semiconductor materials, but GaAs semiconductor materials make better multi-layer mirror systems than InP semiconductor materials. A high reflectivity mirror system is needed in a VCSEL because the light resonates in a direction that is perpendicular to the pn-junction. The cavity or active region of a VCSEL is thus relatively short and a photon has little chance of stimulating the emission of an additional photon with a single pass through the active region. To increase the likelihood of stimulating the emission of photons, VCSELs require highly efficient mirror systems such that a photon can make multiple passes through the active region. The reflectivity is currently achieved using Distributed Bragg Reflector (DBR) layers.

One problem associated with VCSELs is related to the wavelength of the light that is generated. Current VCSELs typically generate light that has a wavelength of approximately 0.85 microns. This wavelength is primarily useful in very short distance fiber optic communications but is typically inadequate for longer distance fiber optic networks such as telecommunication networks. Attempts to develop and fabricate VCSELs that operate at longer wavelengths (1.3 microns and 1.55 microns, for example) and at higher power have proven to be very difficult. This difficulty is related to the fact that InP semiconductor materials permit the growth of a suitable active region for generating longer wavelengths, but the InP DBR layers are not effective. When GaAs semiconductor materials are used, the growth of the DBR layers is straightforward, but the active region is unsuitable. In addition, attempts to increase the power produced by VCSELs results in multimode emission. The difficulty in fabricating and designing the multiple DBR layers and the need for the lattice structures of the various layers in the VCSEL to match are additional reasons that impede the successful creation of a high power single mode VCSELs. Typically, attempts to create such VCSELs have resulted in VCSELs that produce insufficient power, are unreliable, or generate multiple modes.

BRIEF SUMMARY OF AN EXEMPLARY EMBODIMENT OF THE INVENTION

These and other limitations are addressed by the present invention, which relates to a single mode vertical cavity surface emitting lasers using photonic crystals with a central defect. More specifically, a single mode is achieved by forming a mirror layer of a VCSEL using photonic crystals or a combination of photonic crystals and Distributed Bragg Reflector (DBR) layers. The photonic crystal also includes a central defect to facilitate propagation of the emitted mode of laser light. Power in the single mode can be increased without the emission of addition modes.

A photonic crystal or layer is a material, such as a semiconductor material or a dielectric material, in which cavities or holes are formed. The cavities or holes formed in the photonic crystal usually have a periodic structure. The periodic cavity structure of a photonic crystal is not limited by the atomic lattice structure of the material and can be formed as required using various lattice configurations and cavity shapes. Because the photonic crystals used in the present invention are planar in nature, the periodic cavity structure is usually two dimensional, although a three dimensional photonic crystal is contemplated by the present invention. A central defect is created when cavities or holes are not formed in a portion of the photonic crystal. Typically, the central defect corresponds to an aperture of the VCSEL where laser light is emitted.

In one embodiment of the present invention, a photonic crystal with a central defect is formed on the upper DBR layers of a VCSE. Alternatively, periodic cavity structure is formed in the DBR layers, thereby making the DBR layers photonic. The reflectivity of the photonic crystal is dependent on the wavelength of the light and on the angle of incidence. The photonic crystal provides the necessary reflectivity for a single mode such that a single mode is reflected through the active region, which results in stimulated emission of photons at the corresponding wavelength of the incident photon. The photonic crystal does not provide sufficient reflectivity for other modes and as a result, those modes do not have appreciable gain.

The particular mode or wavelength emitted by a VCSEL can be changed by varying or altering attributes or characteristics of the photonic crystal. Exemplary attribute changes include, but are not limited to, changing the cavity structure to another lattice configuration, changing the dimensions of the central defect, altering the shape of the individual cavities, adding another photonic crystal or layer to the VCSEL, and the like or any combination thereof. With photonic crystals as mirrors, longer wavelengths can be generated by the VCSEL. The VCSEL can also be configured to emit a particular wavelength by controlling the refractive index of the photonic crystal by filling the cavities with another material. Additional layers of photonic crystals may extend the band of wavelengths for which high reflectivity is achieved.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF EXEMPLARY EMBODIMENTS OF THE INVENTION

At a basic level, vertical cavity surface emitting lasers (VCSELs) are essentially pn-junctions that convert electrical energy into light energy. Typically, a gain medium or active region is formed at the pn-junction between the p-type semiconductor material and the n-type semiconductor material. The active region often includes quantum wells that can be either compressively or tensile strained quantum wells. The active region may also include quantum dots.

In VCSELs, mirrors or mirror layers are formed both above and below the active region. The mirrors reflect light or photons back and forth the through the active region of the VCSEL. Within the VCSEL cavity that is effectively bounded by the mirrors or by this mirror system, the light resonates vertically or perpendicularly to the pn-junction. Because the light is resonating vertically, the cavity length of a VCSEL is often very short with respect to the direction of light travel. The length of the cavity thus has an effect on the ability of a photon to stimulate the emission of additional photons, particularly at low carrier densities. Some of the light escapes the mirror system and emerges from a surface of the VCSEL.

The mirrors or the mirror system of a VCSEL must be highly reflective and this high reflectivity requirement cannot be achieved through the use of metallic mirrors. As previously stated, VCSELs currently employ Distributed Bragg Reflector (DBR) layers that are formed by forming or growing alternating layers of semiconductor or dielectric materials whose refractive index varies. Light is reflected at the junctions of these alternating layers and in order to achieve the high reflectivity required by VCSELs, many layers must be formed or grown. In one example, each VCSEL has on the order of 50 to 100 individual DBR layers for both the upper and lower mirrors.

The present invention relates to single mode vertical cavity surface emitting lasers that generate or emit single modes at various wavelengths including longer wavelengths that are more suitable for optical communication systems. VCSELs structured as described herein also have the advantage of being able to generate increased power in a single mode. These and other advantages are achieved by forming the mirror system or mirror layers of VCSEL using photonic crystals with a central defect or using a combination of DBR layers and photonic crystals with a central defect.

Figure 1:
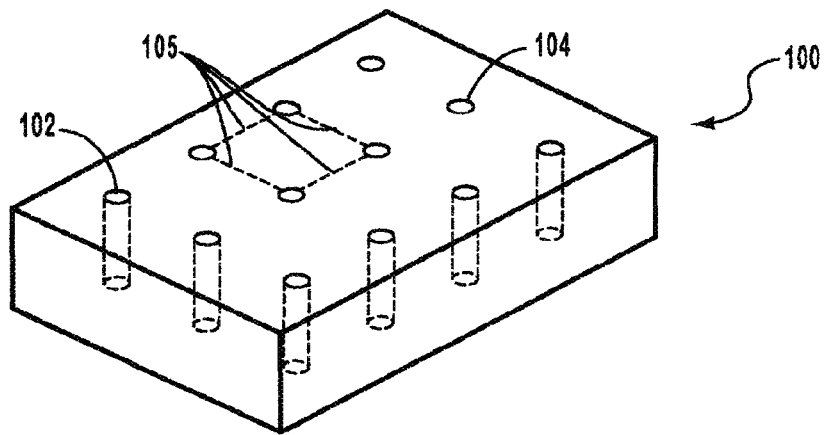
FIG. 1 is a perspective view of a photonic crystal or layer with a periodic cavity structure.

A photonic crystal is a material that has a cavity or hole structure formed therein that is related to the wavelengths emitted by the VCSEL. In other words, the reflectivity of photonic crystals is wavelength dependent and the particular wavelength reflected by a photonic crystal is often related to the cavity or hole structure of the photonic crystal. FIG. 1 illustrates an exemplary photonic crystal or layer. A plurality of cavities or holes that are periodic in nature are formed or structured in the photonic crystal 100. DBR layers can become a photonic crystal when the periodic cavity structure is formed in the DBR layers.

Cavities 102 and 104 are examples of the cavities that are thus drilled in the photonic crystal 100 after the material is formed on the VCSEL in a thin layer or film. Each cavity typically passes through the photonic crystal 100. It is also possible for the cavity structure to be formed such that the photonic crystal 100 is not perforated by cavities. In another example, the cavities pass completely through the photonic crystal and extend into other layers of the VCSEL. The cavities are formed or placed in the photonic crystal 100 using, for example, lithography techniques. The distance between cavities in the cavity structure affect the wavelength of laser light that is generated by the VCSEL. In one example, the photonic crystal 100 enables VCSELs to generate wavelengths on the order of 1.3 to 1.55 microns in a single mode.

The wavelength(s) emitted by a VCSEL can be altered by changing characteristics or attributes of the photonic crystal. Characteristics or attributes that can be changed such that a VCSEL emits a different wavelength(s) include, but are not limited to, the lattice structure of the cavities (rhombic cavity structure, square cavity structure, triangular cavity structure, hexagonal cavity structure, and the like), the shape of the cavities (circular, square, triangular, and the like), the angle of the cavities with respect to the surface of the photonic crystal, the depth of the cavities, the material from which the photonic crystal is formed, the thickness of the photonic crystal, the size and shape of a central defect in the photonic crystal, and the like or any combination thereof. The reflectivity of the photonic crystal is also dependent on wavelength and incident angle. Thus, a VCSEL with a photonic crystal may be designed to emit a single mode and the wavelength of the emitted mode is related to the photonic crystal.

Figure 2A:
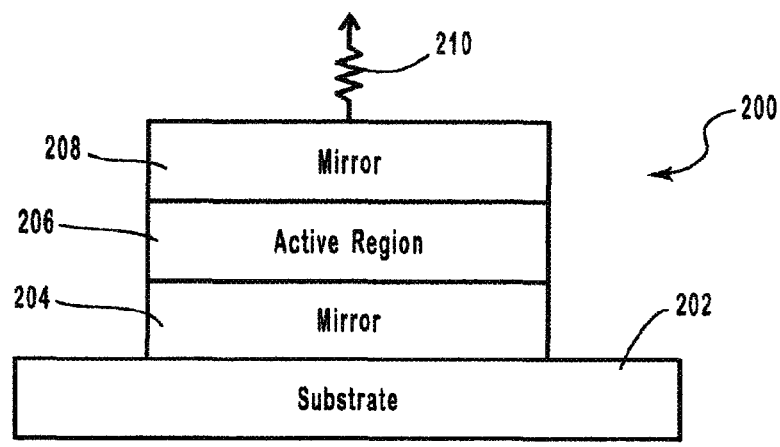
FIG. 2A illustrates a vertical cavity surface emitting laser where the mirror layers are formed from photonic crystals and/or DBR layers.

FIG. 2A is a block diagram that illustrates generally the structure of a VCSEL in accordance with the present invention. The VCSEL 200 begins with a substrate 202. A lower mirror layer 204 is formed or grown on the substrate 202. An active region 206 is next formed or grown on the mirror layer 204. On the active region 206, an upper mirror layer 208 is grown or formed. As the mirror layers 204 and 208 repeatedly reflect light or photons through the active region 206, the laser light 210 is ultimately generated and exits the VCSEL 200 as laser light 210.

The active region 206 is typically formed from a semiconductor material. The mirror layers 204 and 208 can be formed from or include photonic crystals or layers. The photonic crystals provide the reflectivity required by the VCSEL 200 and are not as difficult to grow as the multiple DBR layers previously discussed.

The photonic crystal is typically formed as a thin film on the upper DBR layers or directly on the active region. Cavities are then drilled in the thin film of material as previously described to form the photonic crystal. Employing photonic crystals in the mirror layers of a VCSEL makes VCSELs easier to fabricate and reduces cost. In addition, VCSELs that emit different wavelengths of light can be fabricated on the same wafer by controlling the cavity structures or other attributes of the photonic crystals.

The photonic crystals can be formed, for example, from GaAs, AlGaAs, InGaAs, InP, GaInAsP, AlGaInAs, InGaAsN, InGaAsSb, and the like. The photonic crystals can also be formed from dielectric materials that can be deposited in a thin film. The material used to fill the cavities also extends to similar materials, although the cavities are often filled with air. The resonance frequency of the photonic crystal can be altered or changed if the refractive index of the material used to form the photonic crystal and/or fill the cavities is tunable.

Figure 2B:
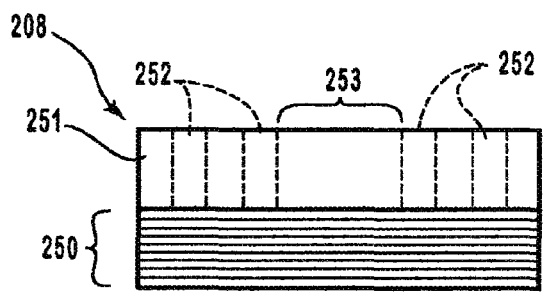
FIG. 2B illustrates a mirror layer that includes a photonic crystal with a central defect and Distributed Bragg Reflector layers.

FIG. 2B illustrates an exemplary mirror layer 208. In FIG. 2B, the mirror layer 208 includes both DBR layers 250 and the photonic crystal 251. The mirror layer 208 is formed on the active region of the VCSEL. In this example of the mirror layer 208, the number of DBR layers required to attain sufficient reflectivity is reduced because of the reflectivity of the photonic crystal 251. FIG. 2B illustrates cavities 252 that have been formed in a lattice or cavity structure in the photonic crystal 251. The cavity structure of the photonic crystal 251 includes a central defect 253. In FIG. 2B, the central defect 253 does not include any cavities. The present invention, however, extends to embodiments where one or more cavities are formed in the central defect 253 as described in more detail in FIG. 4B.

Figure 2C:
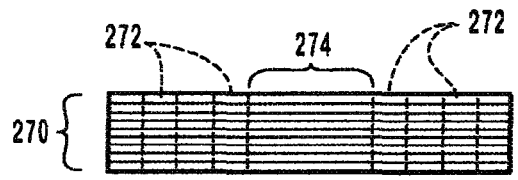
FIG. 2C illustrates a mirror layer that includes a photonic crystal with a central defect and Distributed Bragg Reflector layers and FIG. 2D illustrates the mirror layer of FIG. 2C with an additional photonic crystal.
Figure 2D:
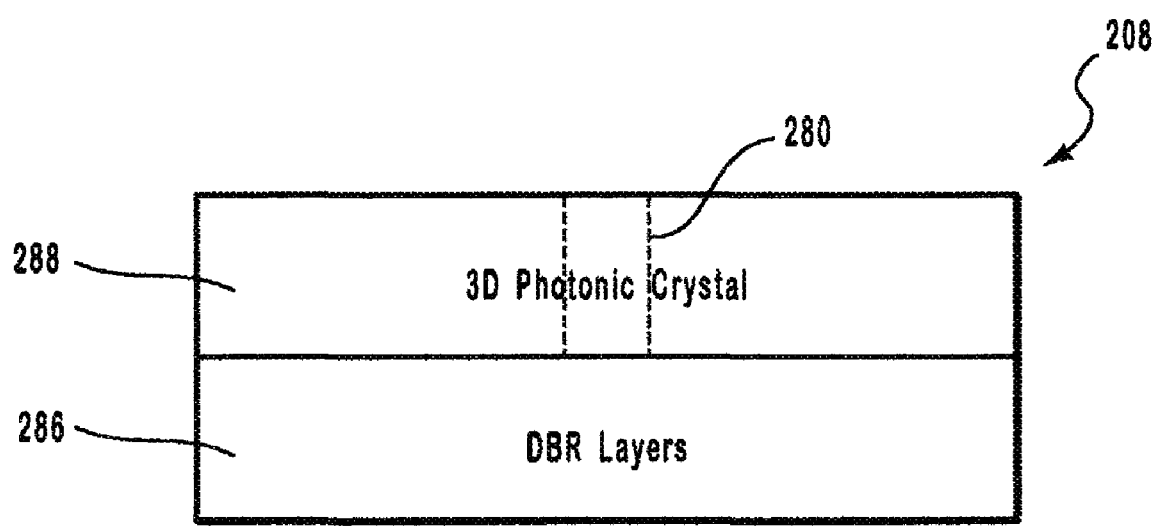

FIG. 2C illustrates another example of the mirror layer 208 where the cavities 272 have been drilled or formed directly in the DBR layers 270. The DBR layers 270 are thus photonic in nature. The reflectivity achieved by the photoninc DBR layers 270 is related to both the junctions of the individual DBR layers and/or the periodic cavity structure. This example of a photonic mirror also includes a central defect 274. The mirror layers illustrated in FIGS. 2B, and 2C can also be used as the mirror layer 204 of the VCSEL shown in FIG. 2A. FIG. 2D is a schematic representation of a mirror layer 208 that includes DBR layers 286, and a three dimensional photonic layer 288 having a central defect 280. Thus, one embodiment of the invention includes a lower mirror, and active region and an upper mirror layer, where the upper mirror layer includes a plurality of DBR layers; and a photonic crystal layer is above the DBR lasers and has a three dimensional periodic structure that includes a central defect.

Figure 3:
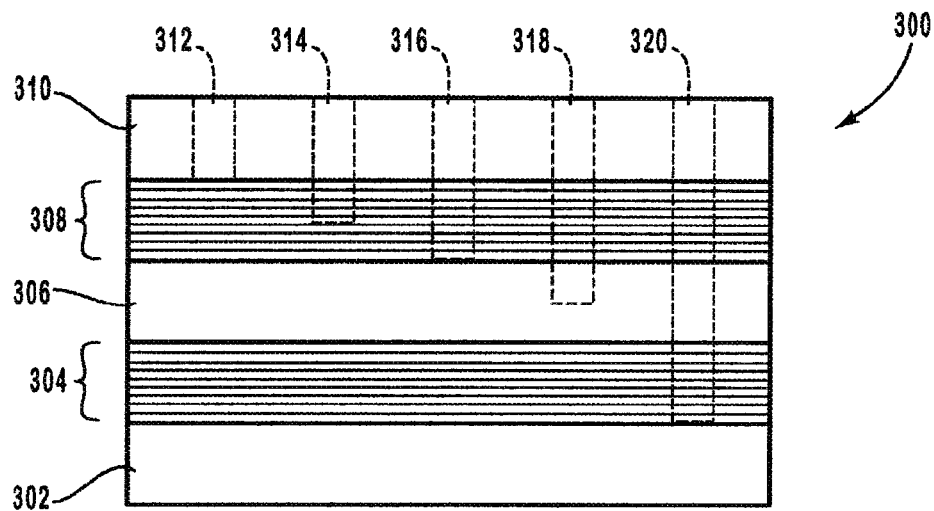
FIG. 3 illustrates that the cavities or holes formed in the photonic crystal can have different depths and that the cavities can extend into other layers of the vertical cavity surface emitting laser.

FIG. 3 illustrates another example of a VCSEL 300 that incorporates photonic crystals in a mirror layer of a VCSEL. In this example, the lower mirror layer of the VCSEL 300 is formed from DBR layers 304. The upper mirror layer of the VCSEL 300 is a combination of the DBR layers 308 and a photonic crystal 310. When photonic crystals are included as part of the mirror layers, the number of DBR layers 308 can be reduced or omitted completely.

FIG. 3 also illustrates that the cavities formed in the photonic crystal can have depths that extend into other layers of the VCSEL 300. For example, the cavity 312 is limited to the photonic crystal 310 and does not penetrate the DBR layers 308 while the cavity 314 extends into the DBR layers 308. The cavity 316 extends completely through the upper DBR layers 308, the cavity 318 extends into the active region 306, and the cavity 320 extends into the lower DBR layers 304. The depth of the cavities that are formed in the VCSEL 300 can vary and typically have an impact on the mode(s) that are emitted by the VCSEL 300. In one embodiment of a VCSEL, all cavities are typically formed to substantially the same depth. For example, all of the cavities may extend into the active region. In another embodiment, the depth of the cavities can vary.

Figure 4A:
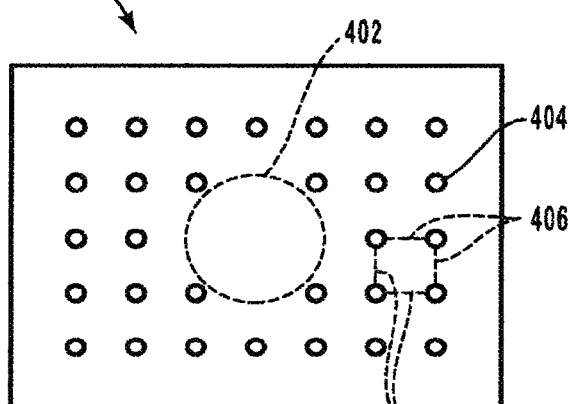
FIG. 4A illustrates a top view of a vertical cavity surface emitting laser that includes a photonic crystal with a central defect.

FIG. 4A is a top view of a VCSEL whose structure includes a photonic crystal with a central defect. Typically, the cavities of the photonic crystal are formed in the VCSEL after the photonic crystal has been formed as a thin film on the active region or DBR layers of a VCSEL. The cavities or holes are then drilled using, for example, electron lithography or other lithography technique. FIG. 4A illustrates that the cavities formed in the VCSEL 400 have been formed using a square lattice or cavity structure 406. As previously described, the cavities can be formed using other lattice or cavity structures as well.

A central defect 402 is formed by not drilling or forming cavities or holes in a portion of the photonic crystal. In other words, the central defect 402 does not include any cavities or holes. In one embodiment, the central defect 402 permits the single mode to propagate through the photonic crystal and exit the VCSEL 400. The central defect 402 is defined by the lattice of cavities formed in the VCSEL. Because of the wavelength dependence of the reflectivity of the photonic crystal, the VCSEL lases at a single mode. In addition, the emitted mode may have a wavelength on the order of 1.3 or 1.55 micrometers, although the present invention is not limited to these wavelengths. The central defect 402 can be designed to control the mode emitted by the VCSEL 400.

Figure 4B:
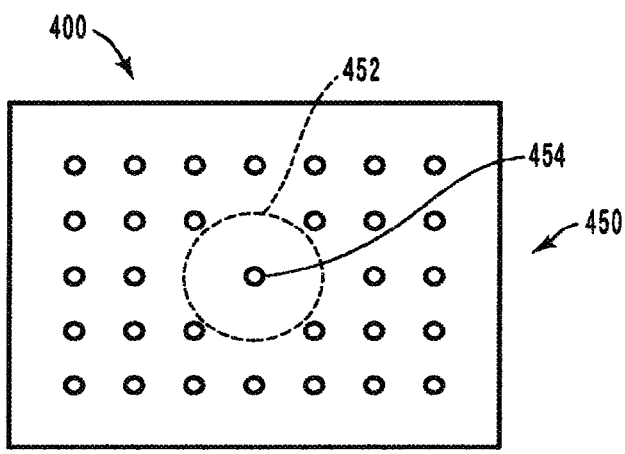
FIG. 4B illustrates a top view of a vertical cavity surface emitting laser that include a photonic crystal with a central defect.

FIG. 4B illustrates another example of a central defect formed in a photonic crystal. In the example of FIG. 4B, the photonic crystal 450 includes a central defect 452 that is surrounded by a lattice structure of cavities. In this example, a single hole or cavity 454 is formed in the central defect 452. In one embodiment, the cavity 454 is formed in the center of the central defect 452. The central defect 452 thus has a ring or doughnut shape. In addition, the cavity 454 can be shaped to select a particular polarization state. The cavity 454, for example, may have an ellipsoidal shape.

Figure 5:
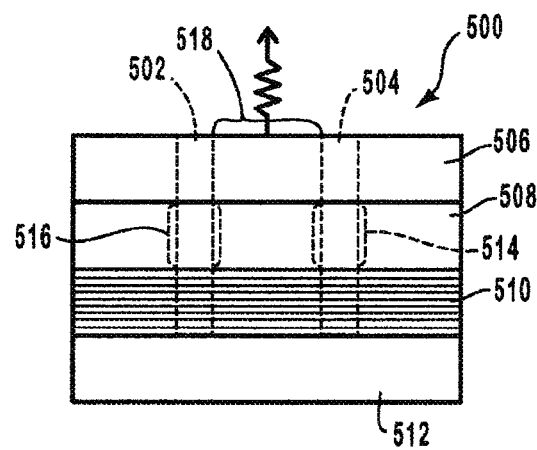
FIG. 5 illustrates a vertical cavity surface emitting laser where the cavities formed in the photonic crystal extend into the active region and are surrounded by a semi-insulating material in the active region.

FIG. 5 illustrates a cross section of a VCSEL 500 that includes a central defect 518 surrounded by cavities that extend through both the photonic crystal 506 and the active region 508, and into the lower DBR layers 510. Because the cavities extend into the active region 508, additional surface area is introduced in the active region. Surface recombination of carriers increases the threshold current of the VCSEL 500 and may even prevent the VCSEL 500 from lasing. To prevent surface recombination of carriers where the cavities 502 and 504 traverse the active region 508, semi-insulating regions are been grown in the active region. The problems associated with surface recombination are thereby reduced or eliminated because the surface exposed by the cavities are within the semi-insulating regions. In addition, the benefits of the cavities as described herein are not sacrificed. In one example, the composition of the semi-insulating region is FeInP.

More specifically, after the active region has been formed on the lower DBR layers 510, the semi-insulating regions 516 and 514 are formed in the active region by first removing some of the active region from locations that correspond to where the cavities of the photonic crystal will be formed. The semi-insulating regions 514 and 516 are then formed in the active region 508 at places where the cavities 504 and 502 will traverse the active region such that the cavities are surrounded by the semi-insulating materials in the active region. After the semi-insulating regions 514 and 516 have been formed, the photonic crystal 506 is formed on the active region as a thin film. Finally, the cavities 502 and 504 are drilled in the predetermined lattice structure or cavity structure. Note that the semi-insulating regions have the same periodic structure as the cavities. The cavities are thus drilled such that the cavities penetrate the previously formed semi-insulating regions 514 and 516. This has the effect of creating ring shaped semi-insulating regions. In this manner, the effects of surface recombination of carriers are reduced or eliminated by the semi-insulating regions.

The photonic structure also helps to confine the light is a lateral direction as it reflects off of the cavities or holes formed in the VCSEL. The central defect can therefore have a very small radius, which enables low-power or single mode operation. As previously indicated, the central defect can be populated with additional holes or cavities such that a given mode and/or polarization state can be selected.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A vertical cavity surface emitting laser, comprising:
   a substrate;
   a lower mirror layer formed above the substrate;
   an active region formed above the lower mirror layer, the active region comprising a plurality of quantum wells;
   an upper mirror layer formed above the active region, the upper mirror comprising a first photonic crystal layer and comprising a plurality of holes forming a periodic structure in the first photonic crystal layer, the plurality of holes extending into the active region;
   a semi-insulating material surrounding the plurality of holes in the active region, thereby isolating the plurality of quantum wells from the plurality of holes; and
   a central defect in the first photonic crystal, wherein the central defect is operatively arranged to effectuate a particular polarization state.

2. The vertical cavity surface emitting laser as recited in claim 1, wherein the first photonic crystal comprises a plurality of DBR layers.

3. The vertical cavity surface emitting laser as recited in claim 1, wherein the periodic structure of the first photonic crystal is two dimensional.

4. The vertical cavity surface emitting laser as recited in claim 1, wherein the periodic structure of the first photonic crystal is three dimensional.

5. The vertical cavity surface emitting laser as recited in claim 1, wherein the first photonic crystal substantially comprises a material having a tunable refractive index.

6. The vertical cavity surface emitting laser as recited in claim 1, wherein the upper mirror layer further comprises a plurality of DBR layers interposed between the active region and the first photonic crystal.

7. The vertical cavity surface emitting laser as recited in claim 1, wherein the central defect of the first photonic crystal facilitates propagation of a single mode from the vertical cavity surface emitting laser.

8. The vertical cavity surface emitting laser as recited in claim 1, wherein upper mirror layer comprises a plurality of DBR layers and a thin film formed above the DBR layer and wherein the periodic structure extends through the thin film.

9. The vertical cavity surface emitting laser as recited in claim 8, wherein the thin film comprises a dielectric material.

10. The vertical cavity surface emitting laser as recited in claim 1, wherein the DBR layers of the upper mirror comprise a semiconducting material and the photonic crystal layer formed above the DBR layers comprises a dielectric material.

* * * * *